(12) United States Patent
Bobba et al.

(10) Patent No.: US 6,552,576 B1
(45) Date of Patent: Apr. 22, 2003

(54) NOISE IMMUNE TRANSMISSION GATE

(75) Inventors: Sudhakar Bobba, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/096,611

(22) Filed: Mar. 12, 2002

(51) Int. Cl.$^7$ .............................. H03K 19/094
(52) U.S. Cl. ......................... 326/113; 326/83
(58) Field of Search ................ 326/112–114, 119, 326/121, 122, 83

(56) References Cited

U.S. PATENT DOCUMENTS

| | | | | |
|---|---|---|---|---|
| 5,426,383 A | * | 6/1995 | Kumar ..................... | 326/119 |
| 5,796,624 A | * | 8/1998 | Sridhar et al. ............... | 703/14 |
| 6,163,199 A | * | 12/2000 | Miske et al. ............... | 327/434 |
| 6,310,491 B1 | * | 10/2001 | Ogawa ..................... | 326/46 |
| 6,384,635 B1 | * | 5/2002 | Kato ..................... | 326/113 |

FOREIGN PATENT DOCUMENTS

JP        63141228 A   *   6/1988  ......... G05D/23/27

OTHER PUBLICATIONS

Sedra et al., Microelectronic Circuits, 1998, Oxford University Press, Fourth Edition, pp 356–359.*

* cited by examiner

*Primary Examiner*—Michael Tokar
*Assistant Examiner*—James H Cho
(74) *Attorney, Agent, or Firm*—Rosenthal & Osha L.L.P.

(57) ABSTRACT

A transmission gate immune to noise that selectively delivers/draws charge to/from a noisy input node in order to ensure that an output node is not adversely affected by the noise on the input node is provided. Further, an NMOS pass gate immune to noise that delivers charge to a noisy input node in order to ensure that an output node is not adversely affected by the noise on the input node is provided. Further, a PMOS pass gate immune to noise that draws charge from a noisy input node in order to ensure that an output node is not adversely affected by the noise on the input node is provided.

17 Claims, 2 Drawing Sheets

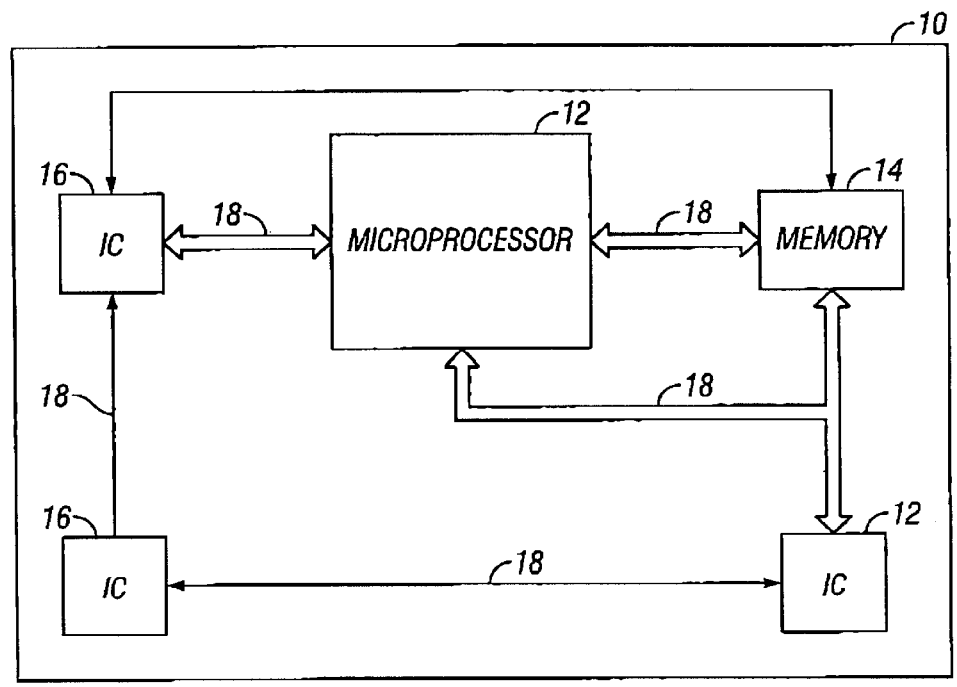
FIG. 1
*(Prior Art)*
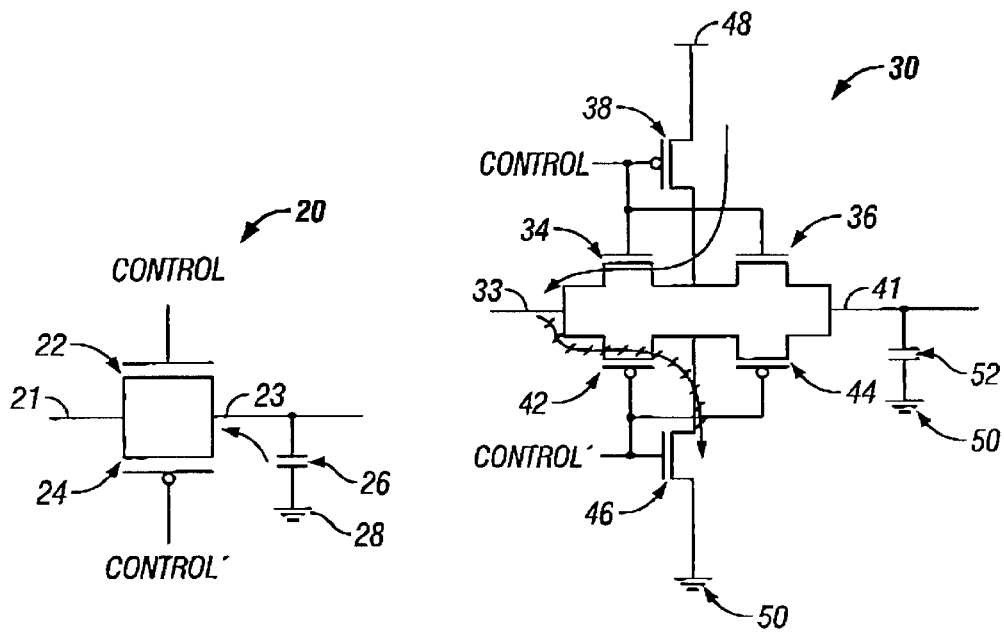
FIG. 2
*(Prior Art)*
FIG. 3

NOISE IMMUNE TRANSMISSION GATE

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and signals, that are necessary for the transfer of data among the aforementioned components of the computer system (10).

The operation of a computer system, such as the one shown in FIG. 1, requires the presence of signals to transmit information from one point in the computer system to another point in the computer system. Such signals are used to facilitate the transmission of various data. For example, a clock signal is used to transmit a reference of time to various components within a computer system. In another example, a data signal is used to transmit actual data to particular components within a computer system. In sum, the use of signals is imperative to the operation of a computer system in that without the presence of signals, computer system components would be unable to communicate with one another, effectively making the computer system unusable.

In some cases, it is desirable to be able to selectively control the passage of a signal from one point to another. One approach designers have used to achieve this end involves the use of transmission gates. When the transmission gate is enabled via a control signal, i.e., when the transmission gate is 'on,' the transmission gate provides a low impedance path between a node residing at an input of the transmission gate and a node residing at an output of the transmission gate. When the transmission gate is disabled via the control signal, i.e., when the transmission gate is 'off,' the transmission gate provides a high impedance path between the node at the input of the transmission gate and the node at the output of the transmission gate.

A transmission gate may be viewed as a switch that selectively controls the connection between two points. When enabled, the transmission gate allows the passage of a signal from one node to another, and alternatively, when disabled, the transmission gate blocks the passage of the signal from one node to the other.

To illustrate the design and use of a transmission gate, FIG. 2 shows a typical transmission gate (20). The transmission gate (20) is made up of an NMOS transistor (22) and a PMOS transistor (24), where the source and drain terminals of the NMOS transistor (22) are respectively connected to the source and drain terminals of the PMOS transistor (24). A first node (21) residing at an input of the transmission gate (20) is connected to one set of the connected terminals between the NMOS transistor (22) and the PMOS transistor (24), and a second node (23) residing at an output of the transmission gate (20) is connected to the other set of connected terminals between the NMOS transistor (22) and the PMOS transistor (24). Moreover, a control signal (shown in FIG. 2 as CONTROL) is connected to the gate terminal of the NMOS transistor (22), and a complement of the control signal (shown in FIG. 2 as CONTROL') is connected to the gate terminal of the PMOS transistor (24). Further, a capacitor (26) positioned between the second node (23) and ground (28) is shown as capacitors are often used in circuit design to decouple noise, i.e., remove adverse power variation effects, from a node.

When the control signal goes/is high, the transmission gate (20) switches/is 'on' as the NMOS transistor (22) and the PMOS transistor (24) switch 'on.' In this case, the 'on' states of the NMOS and PMOS transistors (22, 24) provide a low impedance path between the first node (21) and the second node (23), thus enabling a signal from the first node (21) to pass to the second node (23). Alternatively, when the control signal goes/is low, the transmission gate (20) switches/is 'off' as the NMOS transistor (22) and the PMOS transistor (24) switch 'off.' In this case, the 'off' states of the NMOS and PMOS transistors (22, 24) provide a high impedance path between the first node (21) and the second node (23), thus blocking a signal from passing from the first node (21) to the second node (23). Therefore, by selectively enabling and disabling a transmission gate, the passage of a signal from one point in a circuit to another may be controlled.

Ideally, when the transmission gate (20) is 'off,' there should be high impedance between the first node (21) and the second node (23) irrespective of the signals on the first and second nodes (21, 23). The presence of capacitive or inductive coupling noise on the signals on the first and second nodes (21, 23) may disrupt the functionality of the transmission gate (20). In other words, it is undesirable for there to be a conduction path between the first and second nodes (21, 23) when the transmission gate (20) is supposed to be 'off.'

A situation where such an undesirable conduction path forms is when the voltage at the first node (21) swings below the low voltage threshold of the NMOS transistor (22) due to, for example, ground bounce or coupling noise. In this case, the NMOS transistor (22) switches 'on' for some finite amount of time causing charge to leak away from the second node (23) (as indicated by the arrow in FIG. 2). If the second node (23) is a sensitive node, i.e., a node that is required to have some precise value, the leaking of charge from the second node (23) to the first node (21) may lead to inaccuracies or performance degradation. More so, for sustained noise on the first node (21) below the critical voltage that switches 'on' the NMOS transistor (22), the charge of the capacitor (26) connected to the second node (23) may fall low enough to destroy the state of the second node (23) altogether. This may lead to functional failures.

Thus, there is a need for a transmission gate design that prevents noise on a node connected to the transmission gate from affecting the state of another node connected to the transmission gate.

SUMMARY OF INVENTION

According to one aspect of the present invention, an integrated circuit that has a transmission gate that selectively controls passage of a signal from a first node to a second node comprises a first stage that provides a low impedance path between the first node and the second node when the transmission gate is enabled, where the first stage comprises a current sourcing device that delivers charge to the first node when the transmission gate is disabled and a voltage of the first node goes below a first critical voltage.

According to another aspect, an integrated circuit that has a transmission gate that selectively controls passage of a signal from a first node to a second node comprises a first pass means for providing a low impedance path between the first node and the second when the transmission gate is enabled, where the first pass means comprises charge delivering means for delivering charge to the first node when the transmission gate is disabled and a voltage of the first node goes below a first critical voltage.

According to another aspect, a method for performing circuit operations using a transmission gate that selectively controls passage of a signal from a first node to a second node comprises facilitating the passage of the signal from the first node to the second node when the transmission gate is enabled by a control signal; and sourcing current to the first node when the transmission gate is disabled by the control signal and a voltage of the input node goes below a first critical voltage.

Other aspects and advantages of the invention will be apparent from the following description and the appended claims.

BRIEF DESCRIPTION OF DRAWINGS

FIG. 1 shows a typical computer system.

FIG. 2 shows a typical transmission gate.

FIG. 3 shows a transmission gate in accordance with an embodiment of the present invention.

DETAILED DESCRIPTION

Figure 4:
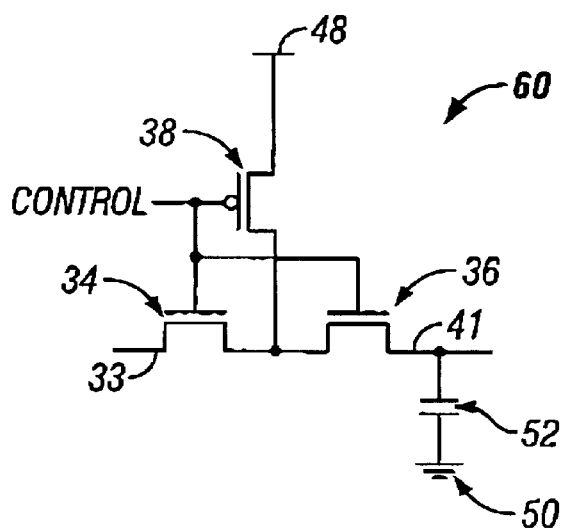
FIG. 4 shows an NMOS pass gate in accordance with an embodiment of the present invention.

Embodiments of the present invention relate to a noise immune transmission gate. Embodiments of the present invention further relate to a method for conducting a circuit operation using a noise immune transmission gate.

The present invention uses a current steering scheme to beneficially provide and draw charge in a transmission gate such that noise on a first node connected to the transmission gate does not affect the state of a second node connected to the transmission gate, thus making the operation of the transmission gate immune to adverse noise effects. In other words, a transmission gate immune to noise that selectively delivers/draws charge to/from a noisy input node in order to ensure that an output node is not affected by the noise on the input node is provided.

FIG. 3 shows a transmission gate (30) in accordance with an embodiment of the present invention. An NMOS stage of the transmission gate (30) is formed by a first NMOS transistor (34), a second NMOS transistor (36), and a first PMOS transistor (38), and a PMOS stage of the transmission gate (30) is formed by a second PMOS transistor (42), a third PMOS transistor (44), and a third NMOS transistor (46).

The source terminal of the first NMOS transistor (34) is connected to the source terminal of the second PMOS transistor (42), and a first node (33) is connected to the connected terminals of the first NMOS transistor (34) and the second PMOS transistor (42). The drain terminal of the first NMOS transistor (34) is connected to the source terminal of the second NMOS transistor (36). The drain terminal of the second NMOS transistor (36) is connected to the drain terminal of the third PMOS transistor (44), and a second node (41) is connected to the connected terminals of the second NMOS transistor (36) and the third PMOS transistor (44). Those skilled in the art will note that the source and drain terminals may be interchanged because transistors are bi-directional devices.

The source terminal of the first PMOS transistor (38) is connected to power (48), and the drain terminal of the first PMOS transistor (38) is connected to the connected terminals of the first NMOS transistor (34) and the second NMOS transistor (36). A control signal (shown in FIG. 3 as CONTROL) to the transmission gate (30) is connected to the gate terminals of the first PMOS transistor (38), the first NMOS transistor (34), and the second NMOS transistor (36).

Still referring to FIG. 3, the drain terminal of the second PMOS transistor (42) is connected to the source terminal of the third PMOS transistor (44), and the source terminal of the third NMOS transistor (46) is connected to the connected terminals of the second PMOS transistor (42) and the third PMOS transistor (44). The drain terminal of the third NMOS transistor (46) is connected to ground (50). The complement of the control signal (shown in FIG. 3 as CONTROL') to the transmission gate (30) is connected to the gate terminals of the third NMOS transistor (46), the second PMOS transistor (42), and the third PMOS transistor (44).

Moreover, a capacitor (52) positioned between the second node (41) and ground (50) is shown as capacitors are often used in circuit design to decouple noise, i.e., remove adverse power variation effects, from a node.

When the control signal goes/is high, the transmission gate (30) switches/is 'on' as the first NMOS transistor (34), the second NMOS transistor (36), the second PMOS transistor (42), and the third PMOS transistor (44) switch 'on.' In addition, when the control signal goes/is high, the first PMOS transistor (38) and the third NMOS transistor (46) switch/are 'off.' In this case, the 'on' states of the first and second NMOS transistors (34, 36) and the second and third PMOS transistors (42, 44) and the 'off' states of the first PMOS transistor (38) and the third NMOS transistor (46) provide a low impedance path between the first node (33) and the second node (41), thus enabling a signal from the first node (33) to pass to the second node (41). Alternatively, when the control signal goes/is low, the transmission gate (30) switches/is 'off' as the first and second NMOS transistors (34, 36) and the second and third PMOS transistors (42, 44) switch 'off.' In this case, the 'off' states of the first and second NMOS transistors (34, 36) and second and third PMOS transistors (42, 44) provide a high impedance path between the first node (33) and the second node (41), thus blocking a signal from passing from the first node (33) to the second node (41).

Continuing with the discussion regarding when the transmission gate (30) is 'off,' because the control signal goes/is low, the first PMOS transistor (38) and the third NMOS transistor (46) switch/are 'on.' If the voltage on the first node (33) goes below the low threshold voltage of the first NMOS transistor (34), the first NMOS transistor (34) switches 'on' for some finite amount of time. In this case, the 'on' first PMOS transistor (38) provides charge, i.e., sources current, from power (48) to the first node (33) through the 'on' first NMOS transistor (34) (where the flow of current in this case is indicated by the non-hashed arrow in FIG. 3). However, the second NMOS transistor (36) remains 'off' because the voltage at its source terminal does not go below the low voltage threshold of the second NMOS transistor (36). Thus, because the second NMOS transistor (36) remains 'off,' charge is not drawn away from the second node (41) by the first node (33).

Alternatively, if the voltage on the first node (33) goes above the high threshold voltage of the second PMOS transistor (42), the second PMOS transistor (42) switches 'on' for some finite amount of time. In this case, the 'on' third NMOS transistor (46) draws charge, i.e., sinks current, from the first node (33) to ground (50) through the 'on' second PMOS transistor (42) (where the flow of current in this case is indicated by the hashed arrow in FIG. 3). However, the third PMOS transistor (44) remains 'off' because the voltage at its source terminal does not go above the high voltage threshold of the third PMOS transistor (44). Thus, because the third PMOS transistor (44) remains 'off,' charge is not delivered to the second node (41) from the first node (33).

Those skilled in the art will appreciate that because a transmission gate in accordance with an embodiment of the present invention, such as the one shown in FIG. 3, provides charge to a noisy node that goes below a critical threshold voltage with respect to the transmission gate and draws charge away from that node when the node goes above a critical threshold voltage with respect to the transmission gate, the transmission gate effectively shields a node that is sensitive, i.e., susceptible to unexpected charge draw or delivery.

Those skilled in the art will note that, in other embodiments, the first node (33) may be a sensitive node while the second node (41) is a noisy node. However, for consistency in this application, the node on the left of the transmission gate has been treated as the noisy node while the node on the right of the transmission gate has been treated as the sensitive node. In other words, a transmission gate in accordance with the embodiments of the present invention is bi-directional.

The parts of a transmission gate in accordance with an embodiment of the present invention, such as the NMOS and PMOS stages (32, 40) shown in FIG. 3, may be used separately. For example, FIG. 4 shows an exemplary NMOS pass gate (60) in accordance with an embodiment of the present invention. The NMOS pass gate (60) is configured similar to the NMOS stage of the transmission gate (30) shown in FIG. 3. When the control signal is high, the NMOS pass gate (60) provides a low impedance path between the first node (33) and the second node (41), thus allowing a signal to pass from the first node (33) to the second node (41).

Alternatively, when the control signal is low, the NMOS pass gate (60) provides a high impedance path between the first node (33) and the second node (41), thereby blocking a signal from passing from the first node (33) to the second node (41). In the case that the voltage of the first node (33) goes below the low voltage threshold of the first NMOS transistor (34), the first PMOS transistor (38) provides charge, i.e., sources current, from power (48) to the first node (33) through the 'on' first NMOS transistor (34) (recall that the first PMOS transistor (38) is 'on' when the control signal goes/is low and that the first NMOS transistor (34) switches 'on' for some finite amount of time when the voltage of the first node (33) goes below the low voltage threshold of the first NMOS transistor (34)). Further, because the control signal is low, the second NMOS transistor (36) is 'off,' thereby ensuring that the state of the second node (41) is not affected by the noise on the first node (33).

Those skilled in the art will appreciate that the embodiment shown in FIG. 4 may be used in situations when it is more critical that the voltage of the sensitive node not go below some particular voltage level than not go above some particular voltage level.

Figure 5:
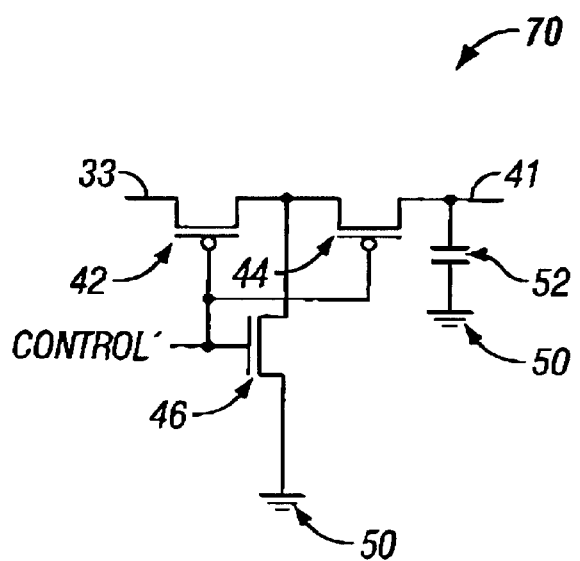
FIG. 5 shows a PMOS pass gate in accordance with an embodiment of the present invention.

FIG. 5 shows an exemplary PMOS pass gate (70) in accordance with an embodiment of the present invention. The PMOS pass gate (70) is configured similar to the PMOS stage of the transmission gate (30) shown in FIG. 3. When the control signal is high, the PMOS pass gate (70) provides a low impedance path between the first node (33) and the second node (41), thus allowing a signal to pass from the first node (33) to the second node (41).

Alternatively, when the control signal is low, the PMOS pass gate (70) provides a high impedance path between the first node (33) and the second node (41), thereby blocking a signal from passing from the first node (33) to the second node (41). In the case that the voltage of the first node (33) goes above the high voltage threshold of the second PMOS transistor (42), the third NMOS transistor (46) draws charge, i.e., sinks current, from the first node (33) to ground (50) through the 'on' second PMOS transistor (42) (recall that the third NMOS transistor (46) is 'on' when the control signal goes/is low and that the second PMOS transistor (42) switches 'on' for some finite amount of time when the voltage of the first node (33) goes above the high voltage threshold of the second PMOS transistor (42)). Further, because the control signal is low, the third PMOS transistor (44) is 'off,' thereby ensuring that the state of the second node (41) is not affected by the noise on the first node (33).

Those skilled in the art will appreciate that the embodiment shown in FIG. 5 may be used in situations when it is more critical that the voltage of the sensitive node not go above some particular voltage level than not go below some particular voltage level.

Advantages of the present invention may include one or more of the following. In some embodiments, because the function of a transmission gate is immune to noise, a node otherwise susceptible to adverse noise effects on another node is not affected by such noise.

In some embodiments, because a noise immune transmission gate ensures that a node connected to an output of the transmission gate is not susceptible to a noisy node connected to an input of the transmission gate, system performance is increased.

In some embodiments, because an NMOS pass gate selectively delivers charge to a noisy input node when the NMOS pass gate is 'off,' the state of the NMOS pass gate's output node is not adversely affected by the noise on the input node.

In some embodiments, because a PMOS gate selectively draws charge from a noisy input node when the PMOS gate is 'off,' the state of the NMOS pass gate's output node is not adversely affected by the noise on the input node.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a transmission gate that selectively controls passage of a signal from a first node to a second node, the transmission gate comprising:

a first stage that provides a low impedance path between the first node and the second node when the transmission gate is enabled, the first stage comprising:

a current sourcing device that delivers charge to the first node when the transmission gate is disabled and a voltage of the first node goes below a first critical voltage; and a second stage that provides a low impedance path between the first node and the second node when the transmission gate is enabled, the second stage comprising:

a current sinking device that draws charge from the first node when the transmission gate is disabled and the voltage of the first node goes above a second critical voltage.

2. The integrated circuit of claim 1, the first stage further comprising:
a first n-type device, wherein the first critical voltage is a low voltage threshold value of the first n-type device.

3. The integrated circuit of claim 2, wherein the current sourcing device delivers charge from a power supply to the first node through the first n-type device.

4. The integrated circuit of claim 2, wherein the current sourcing device is a p-type device, and wherein the first n-type device and the current sourcing device are responsive to a control signal to the transmission gate.

5. The integrated circuit of claim 4, the first stage further comprising:
a second n-type device, wherein the second n-type device is responsive to the control signal.

6. The integrated circuit of claim 1, the second stage further comprising:
a first p-type device, wherein the second critical voltage is a high voltage threshold value of the first p-type device.

7. The integrated circuit of claim 6, wherein the current sinking device draws charge from the first node to a ground terminal through the first p-type device.

8. The integrated circuit of claim 6, wherein the current sinking device is an n-type device, and wherein the first p-type device and the current sinking device are responsive to a control signal to the transmission gate.

9. The integrated circuit of claim 8, the first stage further comprising:
a second p-type device, wherein the second p-type device is responsive to the control signal.

10. The integrated circuit of claim 1, wherein the first node resides at an input of the transmission gate, and wherein the second node resides at an output of the transmission gate.

11. An integrated circuit having a transmission gate that selectively controls passage of a signal from a first node to a second node, the transmission gate comprising:
a first pass means for providing a low impedance path between the first node and the second node when the transmission gate is enabled, the first pass means comprising:
a charge delivering means for delivering charge to the first node when the transmission gate is disabled and a voltage of the first node goes below a first critical voltage; and
a second pass means for providing a low impedance path between the first node and the second node when the transmission gate is enabled, the second pass means comprising:
a charge drawing means for drawing charge from the first node when the transmission gate is disabled and the voltage of the first node goes above a second critical voltage.

12. A method for performing circuit operations using a transmission gate that selectively controls passage of a signal from a first node to a second node, the method comprising the steps of:
facilitating the passage of the signal from the first node to the second node when the transmission gate is enabled by a control signal;
sourcing current to the first node when the transmission gate is disabled by the control signal and a voltage of the first node goes below a first critical voltage; and
sinking current from the first node when the transmission gate is disabled by the control signal and the voltage of the first node goes above a second critical voltage.

13. The method of claim 12, wherein the first critical voltage is a low voltage threshold value of an n-type device that is used to facilitate the passage of the signal when the transmission gate is enabled.

14. The method of claim 13, wherein current is sourced from a power supply to the first node through the n-type device.

15. The method of claim 12, wherein the second critical voltage is a high voltage threshold value of a p-type device that is used to facilitate the passage of the signal when the transmission gate is enabled.

16. The method of claim 15, wherein current is sunk from the first node to a ground terminal through the p-type device.

17. The method of claim 12, wherein the first node resides at an input of the transmission gate, and wherein the second node resides at an output of the transmission gate.

* * * * *